United States Patent [19]

Kubiak et al.

[11] 4,330,360

[45] May 18, 1982

[54] MOLECULAR BEAM DEPOSITION TECHNIQUE USING GASEOUS SOURCES OF GROUP V ELEMENTS

[75] Inventors: Glenn D. Kubiak, Palo Alto, Calif.; Morton B. Panish, Springfield, N.J.

[73] Assignee: Bell Telephone Laboratories, Incorporated, Murray Hill, N.J.

[21] Appl. No.: 170,548

[22] Filed: Jul. 21, 1980

[51] Int. Cl.³ .............................................. C30B 23/06
[52] U.S. Cl. ........................ 156/610; 156/DIG. 70; 156/DIG. 103; 422/245; 427/86; 118/716; 118/725
[58] Field of Search ....... 156/610, 613, 614, DIG. 70, 156/DIG. 103; 422/245; 148/175; 427/255.1, 255.2, 86, 87; 118/716, 719, 724, 725, 733

[56] References Cited

U.S. PATENT DOCUMENTS 4,220,488  9/1980  Duchemin et al. ................. 156/614

OTHER PUBLICATIONS

Cho and Authur, "Molecular Beam Epitaxy", published in Progress in Solid State Chem., vol. 10, pp. 157–191, Oct. 1975.

Morris and Fukui, "A New GaAs Vacuum Deposition Technique", published in J. of Vac. Sci. Technol., vol. #11, Mar. 1974, pp. 506–510.

Casey, Jr., et al., "Application of MBE Layers to Heterostructure Lasers", published in IEEE J. of Quantum Elect., Jul. 1975, pp. 467–470.

Primary Examiner—Gregory N. Clements
Attorney, Agent, or Firm—Michael J. Urbano

[57] ABSTRACT

The invention is a method and apparatus for growing group III–V semiconductor layers by molecular beam deposition in which a gaseous source is used to form a molecular beam comprising $M_2$ or $M_4$ molecules, where M is a group V element. Arsine and phosphine may be decomposed in a high temperature leak-source to provide $As_2$ and $P_2$ molecular beams for molecular beam epitaxy of group III–V semiconductors such as GaAs and InP.

9 Claims, 3 Drawing Figures

MOLECULAR BEAM DEPOSITION TECHNIQUE USING GASEOUS SOURCES OF GROUP V ELEMENTS

TECHNICAL FIELD

This invention pertains to molecular beam deposition and more particularly to a method and apparatus, using a gaseous source to form a group V molecular beam, for the deposition of group III-V semiconductor layers.

BACKGROUND OF THE INVENTION

Conventional molecular beam epitaxy of monocrystalline group III-V semiconductor compounds is usually done with a condensed phase source for the group V element. (See A. Y. Cho and J. R. Arthur, *Progress In Solid State Chemistry*, edited by G. Somorjai and J. McCaldin, Pergamen Press, New York, 1975, Vol. 10, p. 157.) Usually this source is the solid element itself, although some work has been done in which the source of the group V elements is a solution of the group V elements in liquid group III elements.

A gaseous source for the formation of a group V molecular beam has been used in forming polycrystalline group III-V semiconductor layers. (See Morris, F. J. et al, "A New GaAs, GaP, and $GaAs_xP_{1-x}$ Vacuum Deposition Technique Using Arsine and Phosphine Gas", *Journal of Vacuum Science Technology*, Vol. 11, No. 2, Mar./Apr. 1974.)

The solid elemental group V sources have several disadvantages. In the non-ideal effusion ovens used for MBE, solid group V sources are rapidly depleted and change surface area, and thus beam flux, with time. The nonconstant beam flux leads to difficulties in controlling the composition of mixed crystals. Solid phosphorus may cause beam intensity control problems because the solid red phosphorus source generally will consist of an ill-defined mixture of allotropic phases having different vapor pressures.

When the liquid solution of a group V element in a group III element is used as the group V source, the source is initially the group III-V compound in contact with the liquid as the result of preferential loss of group V element at the source temperature. At a given temperature, these sources will provide a constant flux of $As_2$ or $P_2$ as long as the solid group III-V compound remains. But, such sources are usually exhausted quickly because it is inconvenient and expensive to maintain a large volume of source group III-V compounds at the high temperature required. Furthermore, for such sources the group V element beam intensity cannot be varied independently of the group III element beam intensity.

Several studies have demonstrated that the quality of MBE material, at least for $Al_xGa_{1-x}As$, improves with increasing substrate temperature during growth. [See for example, Casey, H. C., et al, *IEEE Journal of Quantum Electronics*, QE. 11, 467 (1975).] At higher substrate temperatures the efficiency with which the group V element is used decreases rapidly, as a result of its rapidly increasing partial pressure over the group III-V compound.

Accordingly, efforts have been directed at developing a method and apparatus for molecular beam deposition of group V elements, useful in forming monocrystalline and polycrystalline group III-V semiconductor layers, in which frequent replenishment of group V elements is not required and which produces an essentially constant beam flux.

Furthermore, there is an increasing interest in group III-V solid solutions including both As and P such as $GaAs_yP_{1-y}$ or $Ga_xIn_{1-x}P_yAs_{1-y}$. Thus, a molecular beam source, which provides for precise control of the group V element beam intensities, is also needed.

SUMMARY OF THE INVENTION

The present invention is a method and apparatus for growing polycrystalline and monocrystalline group III-V semiconductor layers on a semiconductor body in an evacuable chamber by molecular beam deposition.

The group III-V semiconductor layer is formed by directing a group III molecular beam and a group V molecular beam at a semiconductor body within an evacuable chamber. In accordance with one aspect of the invention, the group V molecular beam is formed by introducing $MH_3$ gas, where M is a group V element, into a relatively high pressure chamber. The $MH_3$ gas is decomposed in the high pressure chamber, thereby forming intermediate molecules having a plurality of M atoms.

The intermediate molecules, resulting from the decomposition step, are transported from the high pressure chamber into a relatively low pressure effusion chamber, coupled to the high pressure chamber and the evacuable chamber, effective to further transform the intermediate molecules into $M_2$ molecules and to at least partially rethermalize the molecules therein. A group V molecular beam of predominantly $M_2$ molecules emanates from the low pressure chamber into the evacuable chamber and is directed at the semiconductor body in order to form the group III-V semiconductor layer.

The decomposition step of the above process may be performed by maintaining a region of the high pressure chamber at a sufficiently high temperature and pressure for the reaction

$$4MH_3 \rightarrow M_4 + 6H_2$$

to occur, thereby forming intermediate molecules comprising $M_4$.

In an alternative embodiment of the invention, the low pressure effusion chamber is maintained at a temperature lower than the temperature necessary to transform $M_4$ into $M_2$. In this embodiment, the low pressure chamber is only effective to partially rethermalize the $M_4$ molecules and a molecular beam comprising $M_4$ molecules emanates from the low pressure chamber into the evacuable chamber.

In accordance with another aspect of the invention, the apparatus for forming a group V molecular beam is coupled to the evacuable chamber and is characterized by a relatively high pressure chamber, a relatively low pressure chamber coupled to the evacuable chamber, means coupling the high and low pressure chambers to one another, a means for heating the high and low pressure chambers, and means for introducing $MH_3$ gas into the high pressure chamber. Illustratively, the high pressure chamber is formed by an alumina tube and the low pressure chamber is formed by a portion of the bore of a cylindrical alumina resistance furnace which overhangs one end of the alumina tube. The means coupling the high and low pressure chambers comprises a leaky end seal at the above-mentioned end of the alumina tube. The resistance furnace may be used to heat the high and low pressure chambers. Illustratively, $MH_3$ comprises AsH$_3$, PH$_3$ or a controlled mixture of the two for the formation of mixed crystals such as Ga$_x$In$_{1-x}$P$_y$As$_{1-y}$.

It is an advantage of the invention that the source for the group V elements does not require replenishment inside the evacuable chamber. In addition, the group V beam intensity can be precisely controlled by regulating the MH$_3$ gas pressure in the high pressure chamber.

One particular embodiment of the method and apparatus for forming group V diatomic molecular beams permits the growth of GaAs and InP at temperatures up to approximately 700 degrees C. and 600 degrees C., respectively. For InP this temperature is higher than previously reported temperatures for the growth by MBE of this semiconductor.

It should be noted that the above-mentioned temperatures do not represent fundamental physical limits on the results obtainable with this invention. This invention places no fundamental restriction on substrate temperatures and higher substrate temperatures are possible. For example, growth of GaAs at 750 degrees C. is within the contemplated scope of the invention.

BRIEF DESCRIPTION OF THE DRAWINGS

For purposes of clarity, the figures have not been drawn to scale.

DETAILED DESCRIPTION

This invention is a method and apparatus for growing polycrystalline and monocrystalline group III–V semiconductor layers by molecular beam deposition in which a gaseous source is used to form a group V molecular beam.

Figure 1:
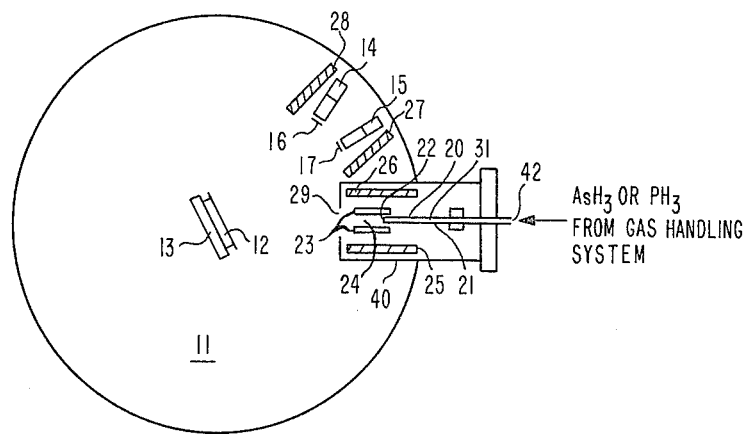
FIG. 1 illustrates the molecular beam deposition apparatus for the formation of group III–V semiconductor layers in accordance with an illustrative embodiment of the invention.

One particular embodiment of the invention is illustrated in FIG. 1. Numerical values stated in connection with this embodiment of the invention are illustrative only and are not intended to limit the scope of the invention. Semiconductor body 12, located within evacuable chamber 11, is affixed to molybdenum heating block 13 with indium (not shown). The effusion cells 14 and 15 for the group III elements may be of a construction known to those skilled in the art. (See for example, Casey et al, U.S. Pat. No. 3,974,002 for a description of a conventional effusion cell, or Cho, U.S. Pat. No. 4,239,955, issued on Dec. 16, 1980, for the description of an improved effusion cell, suitable for use in the present invention.) Illustratively, pyrolytic boron nitride crucibles may be used to contain the group III elements and the heated metal parts may comprise molybdenum or tantalum. The egress of the group III beams from effusion cells 14 and 15 is controlled by shutters 16 and 17. The group III effusion cell to substrate distances are about 12 cm. The group III beam intensities may be regulated by monitoring and varying the effusion cell temperatures. Nominal effusion cell temperatures range from 900–1000 degrees C. for Ga and 800–840 degrees C. for In depending on the effusion cell to substrate distance. Cryopanels 27 and 28 are provided to reduce impurities.

Figure 2:
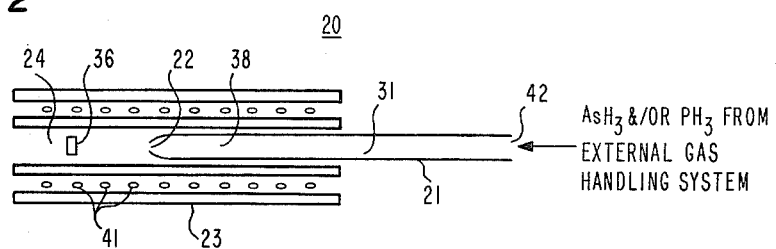
FIG. 2 illustrates a source used to form a group V diatomic molecular beam in accordance with an illustrative embodiment of the invention.

The source 20 for forming the group V molecular beam is shown in FIG. 1 and is shown in greater detail in FIG. 2. The embodiment of the invention illustrated in FIG. 2 is used to form a diatomic group V molecular beam. This source is coupled to chamber 11 and includes a relatively high pressure chamber 31, a relatively low pressure effusion chamber 24 coupled to evacuable chamber 11, means for coupling the low pressure chamber to the high pressure chamber, means for heating the high and low pressure chambers, and means for introducing MH$_3$ gas into the high pressure chamber.

Illustratively, the high pressure chamber 31 is formed by alumina tube 21. The low pressure effusion chamber 24 is formed by the portion of the bore of cylindrical alumina resistance furnace 23 which overhangs end 22 of alumina tube 21. The means, coupling the high pressure chamber 31 to the low pressure chamber 24, comprises a leaky end seal formed at end 22 of alumina tube 21. Alumina resistance furnace 23 which includes heating element 41 may be used to heat chamber 24 and a portion 38 of chamber 31. MH$_3$ gas is introduced into chamber 31 through inlet 42.

Illustratively, alumina tube 21 is about 10 cm. long and has an inner diameter of about 1 mm. The alumina resistance furnace 23 is approximately 6 cm. long. It overlaps approximately 3 cm. of alumina tube 21 and has an inner diameter of approximately 0.3 cm. In an alternative embodiment of the invention, the oven may have an inner diameter of approximately 1 cm.

Cryopanels 25 and 26 are provided in the system to reduce impurities. The source 20 for the group V elements is located inside housing 40 which is attached to the walls of evacuable chamber 11. The molecular beam emanates from low pressure effusion chamber 24 into the evacuable chamber through orifice 29 of housing 40. In some embodiments of the invention, the housing 40 has been omitted. Orifice 29 is about 9 cm. from the substrate surface and has a diameter of approximately 1.0 cm.

The group V molecular beam is formed in the source shown in FIG. 2 as follows. MH$_3$ gas where M is at least one group V element, is introduced from an external gas handling system (not shown) through inlet 42 into the relatively high pressure chamber 31 formed by alumina tube 21. The MH$_3$ gas is decomposed in region 38 of chamber 31. The pressure and temperature of region 38 are maintained at high enough levels for the reaction

$$4MH_3 \rightarrow M_4 + 6H_2$$

to take place, thereby forming intermediate molecules comprising M$_4$. The region 38 is maintained at an elevated temperature by alumina furnace 23 which overlaps several centimeters of alumina tube 21. Illustratively, region 38 is maintained at 800–900 degrees C. during a run by the alumina resistance furnace. Temperatures in the range of 800–900 degrees C. and pressures in the approximate range of $\frac{1}{2}$–3 atm yield almost complete decomposition of MH$_3$ molecules.

Illustratively, arsine (AsH$_3$) or phosphine (PH$_3$) gas is used as the source of the group V elements. For the formation of mixed crystals such as Ga$_x$In$_{1-x}$P$_y$As$_{1-y}$ a controlled mixture of arsine and phosphine gas may be introduced into the high pressure chamber 31 of source 20. Alternatively, mixed crystals including both arsenic and phosphorus may be formed by using two separate sources of the type illustrated in FIG. 2 for these two elements or by having two or more leak source tubes 21 within one furnace 23.

The $M_4$ molecules, formed in the above-mentioned reaction, are transported from high pressure chamber 31, through the leaky end seal at end 22 of alumina tube 21 into the low pressure effusion chamber 24, where the pressure is in the millitorr range.

Illustratively, the leaky end seal at end 22 of the alumina tube is formed by heating one end of the alumina tube until a seal is formed and then removing a sufficient amount of the seal so that the transport of $M_4$ molecules from the high pressure chamber to the low pressure chamber via cracks or pores in the seal is permitted. The leaky end seal should transport gas molecules from the high pressure chamber to the low pressure chamber at a rate small enough to prevent the distance between the source of the group V beam and the substrate from becoming shorter than the mean free path of gas molecules in the evacuable chamber. In addition, the transport of gas through the leaky end seal should be slow enough to prevent the gas pressure in the evacuable chamber from overwhelming the vacuum pump used to evacuate the evacuable chamber. Typically, the leaky end seal has a leak rate such that, with the pressure in the gas handling system at about 3 atm, the pressure in evacuable chamber 11 does not exceed about $1 \times 10^{-4}$ torr during a run. The leaky end seal may be tested in the apparatus shown in FIG. 1 to determine if it has an appropriate leak rate. It should be noted that any means capable of transporting gas molecules from the high pressure chamber 31 to the low pressure chamber 24 at the above-mentioned rates may be used as an alternative to the leaky end seal.

Gas transported through the leaky end seal behaves in a manner similar to that of a free jet formed by the expansion of a gas through a nozzle into a low-pressure region. Thus, the $M_4$ molecules flowing through the leaky end seal are in a hydrodynamic flow regime. Within the effusion chamber 24 it is advantageous for a transition from hydrodynamic to molecular flow to take place, in order to form an effusive beam.

Ideally, since the leaky end seal essentially forms a free jet, a shock wave in the low pressure effusion chamber 24 can be expected to rethermalize the velocity distribution of the molecules in the region. In the illustrative embodiment of the invention described up to now, this rethermalization is only partially complete.

Figure 3:
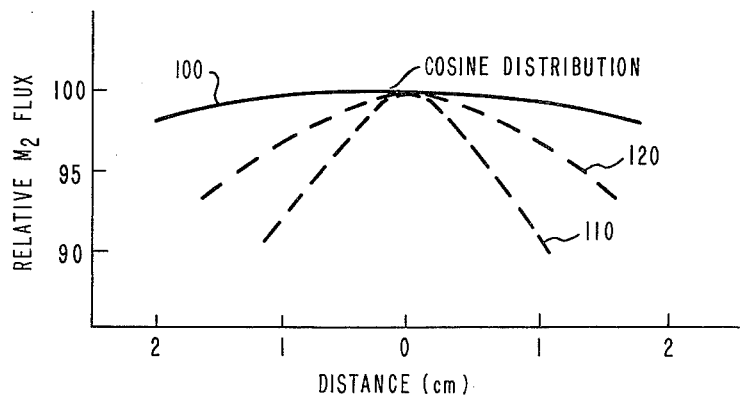
FIG. 3 illustrates the spacial distribution of group V molecular beams formed by the source illustrated in FIG. 2.

FIG. 3 plots the spacial distribution of a predominantly diatomic group V molecular beam as a function of distance from the beam axis. Curve 100 illustrates the cosine distribution of a molecular beam emanating from a purely effusive source. Curve 110 illustrates the spacial distribution of a molecular beam produced by the source of FIG. 2 as it has been heretofore described. This beam is much more sharply peaked than the cosine distribution and thus still retains some of the character imposed by hydrodynamic flow.

Alumina baffle 36 may be included within effusion chamber 24 of FIG. 2 to further the rethermalization of molecules in effusion chamber 24. The ordered hydrodynamic flow of the $M_4$ molecules transported through the leaky end seal is converted to disordered molecular flow by interaction with baffle 36. This interaction broadens the spacial distribution of the group V molecular beam emitted from effusion chamber 24, thereby producing a distribution which more closely approaches the cosine distribution characteristic of an effusive source. Curve 120 of FIG. 3 illustrates the broadening of the beam distribution that may be obtained using a single baffle in region 24. A plurality of baffles in chamber 24 is expected to be more effective in rethermalizing molecules therein than a single baffle.

In addition, the pressure and temperature of low pressure effusion chamber 24 should be effective to further transform the intermediate molecules comprising $M_4$ into diatomic $M_2$ molecules, thereby forming a predominantly diatomic group V molecular beam. Illustratively, this is accomplished by heating the walls of furnace 23 to a temperature in the approximate range of 800 degrees C. to 900 degrees C.

A group V molecular beam comprising $M_2$ molecules is more desirable than a group V molecular beam comprising $M_4$ molecules for applications involving molecular beam deposition because $M_2$ has a higher sticking coefficient to group III-V semiconductor substrates than $M_4$.

However, an alternative embodiment of the present invention may be used to form a group V molecular beam comprising predominantly $M_4$ molecules. In this embodiment separate heating means are used to heat the high and low pressure chambers. $M_4$ molecules, formed by decomposing $MH_3$ gas in the high pressure chamber, are transported from the high pressure chamber to the low pressure chamber. In this embodiment of the invention, the low pressure chamber is maintained at a temperature below that which is necessary to transform $M_4$ molecules into $M_2$ molecules and is used only to partially rethermalize $M_4$ molecules therein, thereby forming a group V molecular beam, comprising $M_4$ molecules, which emanates from the low pressure chamber into the evacuable chamber.

It is to be understood that the above-described method and associated apparatus are merely illustrative of the many possible specific embodiments which can be devised to represent the application of the principles of the invention. Numerous and varied arrangements can be devised in accordance with these principles by those skilled in the art without departing from the spirit and scope of the invention.

EXAMPLES

The embodiment of the invention illustrated in FIGS. 1 and 2 was used to grow the following epitaxial layers.

Epitaxial layers of GaAs were grown on chromium-doped (100) GaAs substrate surfaces that were chemically polished with a $Br_2$-methanol solution and then briefly etched with a peroxide $H_2SO_4$ solution. The growth rate was in the range of 0.45 μm per hour to 1.5 μm per hour. Some of the GaAs layers were doped with Sn from a separate Sn-containing effusion cell (not shown) located within the evacuable chamber.

InP epitaxial layers were also grown on (100) InP substrates that were chemically polished with a $Br_2$-methanol solution. InP growth rates in the range 0.7-1.3 μm per hour were obtained.

As previously indicated, the source of the group V elements illustrated in FIGS. 1 and 2 permitted sufficiently intense beams of $As_2$ or $P_2$ for the growth of GaAs and InP to take place at temperatures on the order of 700 degrees C. and 600 degrees C. respectively. This is the highest temperature as yet reported for the growth of InP by MBE.

We claim:

1. A method for forming a group III-V semiconductor layer by molecular beam deposition including the steps of:
   directing a molecular beam, comprising at least one group III element, at a semiconductor body within an evacuable chamber; and
   simultaneously direction a group V molecular beam at said semiconductor body, thereby forming said group III-V semiconductor layer;
   said group V molecular beam being formed by a process including the steps of:
   introducing $MH_3$ gas, where M is at least one group V element, into a relatively high pressure chamber;
   decomposing said $MH_3$ gas in said high pressure chamber, thereby forming intermediate molecules having a plurality of M atoms;
   transporting said intermediate molecules resulting from said decomposition of $MH_3$ from said high pressure chamber into a relatively low pressure effusion chamber containing at least one baffle therein, said low pressure chamber being coupled to said high pressure chamber and to said evacuable chamber; and
   heating said intermediate molecules in said low pressure chamber and simultaneously causing molecules in said low pressure chamber to interact with said baffle so as to further transform said intermediate molecules into $M_2$ molecules and to form a group V molecular beam comprising $M_2$ molecules which emanates from said low pressure effusion chamber into said evacuable chamber and impinges on said body.

2. The method of claim 1 wherein said decomposing step is performed by:
   maintaining a region of said high pressure chamber at a sufficiently high temperature and pressure for the reaction $$4MH_3 \rightarrow M_4 + 6H_2$$

to occur, thereby forming intermediate molecules comprising $M_4$;
   said $M_4$ molecules being transformed to $M_2$ molecules in said low pressure chamber.

3. The method of claim 1 wherein said semiconductor body comprises InP, said group III element comprises indium, and $MH_3$ comprises phosphine gas.

4. The method of claim 3 wherein said semiconductor body is heated to a temperature at least as high as 600 degrees C.

5. The method of claim 1 wherein said semiconductor body comprises GaAs, said group III element comprises gallium, and $MH_3$ comprises arsine gas.

6. The method of claim 1 wherein $MH_3$ comprises a mixture of arsine and phosphine suitable for producing group III-V semiconductor layers having both arsenic and phosphorous.

7. An apparatus for forming group III-V semiconductor layers comprising:
   an evacuable chamber;
   first means within said evacuable chamber for forming a group III molecular beam; and
   second means coupled to said evacuable chamber for forming a group V molecular beam;
   said second means comprising:
   a relatively high pressure chamber, a relatively low pressure effusion chamber coupled to said evacuable chamber and containing at least on baffle means therein third means coupling said low pressure chamber to said high pressure chamber, fourth means for introducing $MH_3$ gas into said high pressure chamber, said fifth means for heating said high and low pressure chambers;
   the temperature and pressure of said high pressure chamber being effective to decompose said $MH_3$ gas, thereby forming intermediate molecules having a plurality of M atoms;
   said third means, coupling said low pressure chamber to said high pressure chamber, being effective to transport said intermediate molecules resulting from the decomposition of $MH_3$ from said high pressure chamber to said low pressure chamber;
   the temperature and pressure of said low pressure chamber being effective to further transform said intermediate molecules into $M_2$ molecules and said baffle means being effective to broaden the distribution of molecules in said low pressure chamber thereby forming a group V molecular beam comprising $M_2$ molecules which emanates from said low pressure chamber into said evacuable chamber.

8. The apparatus of claim 2 wherein said high pressure chamber comprises an alumina tube, said low pressure chamber comprises a portion of the bore of a cylindrical alumina resistance furance which overhangs one end of said alumina tube, and said fourth means for heating said high and low pressure chambers comprises said resistance furnace.

9. The apparatus of claim 8, wherein said third means, coupling said high and low pressure chambers, comprises a leaky end seal at said one end of said alumina tube formed by heating said one end of said tube until a seal is formed and then removing a sufficient amount of said seal to permit the transport of said intermediate molecules through pores or cracks in the seal.

* * * * *